(12) United States Patent
Park

(10) Patent No.: US 9,954,483 B2
(45) Date of Patent: Apr. 24, 2018

(54) SOLAR CELL MODULE AND METHOD OF FABRICATING THE SAME

(71) Applicant: LG INNOTEK CO., LTD., Seoul (KR)

(72) Inventor: Chi Hong Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/958,344

(22) Filed: Dec. 3, 2015

(65) Prior Publication Data

US 2016/0087580 A1 Mar. 24, 2016

Related U.S. Application Data

(63) Continuation of application No. 14/360,894, filed as application No. PCT/KR2012/009990 on Nov. 23, 2012.

(30) Foreign Application Priority Data

Nov. 25, 2011 (KR) .......................... 10-2011-0124626
Dec. 9, 2011 (KR) .......................... 10-2011-0132368

(51) Int. Cl.
| | | |
|---|---|---|
| H01L 31/042 | (2014.01) | |
| H02S 40/34 | (2014.01) | |
| H02S 30/10 | (2014.01) | |
| H01L 31/02 | (2006.01) | |
| H02S 20/26 | (2014.01) | |

(52) U.S. Cl.
CPC .......... *H02S 40/34* (2014.12); *H01L 31/0201* (2013.01); *H02S 20/26* (2014.12); *H02S 30/10* (2014.12); *Y02B 10/10* (2013.01)

(58) Field of Classification Search
CPC ......... H02S 40/34; H02S 30/10; H01L 31/048
USPC .......................................................... 136/244
See application file for complete search history.

(56) References Cited

U.S. PATENT DOCUMENTS

| | | | |
|---|---|---|---|
| 5,280,133 A | | 1/1994 | Nath |
| 6,066,797 A | * | 5/2000 | Toyomura ............. H01L 31/048 126/569 |
| 6,331,671 B1 | * | 12/2001 | Makita ................... H02S 40/36 136/244 |

(Continued)

FOREIGN PATENT DOCUMENTS

| | | |
|---|---|---|
| CN | 201121386 Y | 9/2008 |
| CN | 201408767 Y | 2/2010 |

(Continued)

OTHER PUBLICATIONS

English Translation of Liu, CN201208767.*

(Continued)

*Primary Examiner* — Jeffrey T Barton
*Assistant Examiner* — Niki Bakhtiari
(74) *Attorney, Agent, or Firm* — Saliwanchik, Lloyd & Eisenschenk

(57) ABSTRACT

A solar cell module according to the embodiment includes a support substrate having a single hole at a peripheral region of the support substrate; solar cells at an upper portion of the support substrate; a bus bar electrically connected to the solar cells; and a junction box connected to the bus bar, wherein the junction box includes an insertion part partially inserted in the single hole.

2 Claims, 6 Drawing Sheets

(56) References Cited

U.S. PATENT DOCUMENTS

| | | | |
|---|---|---|---|
| 2003/0079772 A1* | 5/2003 | Gittings | B32B 17/10036 136/251 |
| 2007/0056625 A1* | 3/2007 | Higuchi | F24J 2/5211 136/244 |
| 2008/0000517 A1 | 1/2008 | Gonsiorawski et al. | |
| 2009/0114261 A1* | 5/2009 | Stancel | H01L 31/05 136/244 |
| 2009/0114262 A1 | 5/2009 | Adriani et al. | |
| 2011/0079284 A1 | 4/2011 | Wu | |
| 2011/0259403 A1 | 10/2011 | Myong et al. | |
| 2012/0152325 A1* | 6/2012 | Podkin | H01L 31/048 136/251 |
| 2012/0174958 A1 | 7/2012 | Park | |

FOREIGN PATENT DOCUMENTS

| | | |
|---|---|---|
| CN | 102237440 A | 11/2011 |
| DE | 102006019210 A1 | 10/2007 |
| JP | 2001-339088 A | 12/2001 |
| KR | 10-2001-0021238 A | 3/2001 |
| KR | 20-2009-0003860 U | 4/2009 |
| KR | 10-2011-0035788 A | 4/2011 |
| TW | 201114049 A | 4/2011 |
| WO | WO-2009029897 A2 | 3/2009 |

OTHER PUBLICATIONS

International Search Report in International Application No. PCT/KR2012/009990, filed Nov. 23, 2012.
Office Action dated Jun. 24, 2016 in Chinese Application No. 201280068132.7.
Office Action dated Jul. 1, 2016 in U.S. Appl. No. 14/360,894.
Office Action dated Oct. 11, 2016 in U.S. Appl. No. 14/360,894.
Office Action dated Jan. 21, 2016 in Chinese Application No. 201280068132.7.

* cited by examiner

SOLAR CELL MODULE AND METHOD OF FABRICATING THE SAME

CROSS-REFERENCE TO RELATED APPLICATIONS

This application is a continuation of U.S. application Ser. No. 14/360,894, filed May 27, 2014, which is the U.S. national stage application of International Patent Application No. PCT/KR2012/009990, filed Nov. 23, 2012, which claims priority to Korean Application Nos. 10-2011-0124626, filed Nov. 25, 2011, and 10-2011-0132368, filed Dec. 9, 2011 the disclosures of each of which are incorporated herein by reference in their entirety.

TECHNICAL FIELD

The embodiment relates to a solar cell module and a method of fabricating the same, and more particularly, to a solar cell module capable of improving the reliability and productivity and a method of fabricating the same.

BACKGROUND ART

Recently, as the lack of an energy resource such as petroleum or coal is expected, the interest in the substitute energy has been more increased. In this regard, a solar cell converting solar energy into electric energy is spotlighted.

A solar cell (or photovoltaic cell) is a core element in solar power generation to directly convert solar light into electricity.

For example, if the solar light having energy greater than bandgap energy of a semiconductor is incident into a solar cell having the PN junction structure, electron-hole pairs are generated. As electrons and holes are collected into an N layer and a P layer, respectively, due to the electric field formed in a PN junction part, photovoltage is generated between the N and P layers. In this case, if a load is connected to electrodes provided at both ends of the solar cell, current flows through the solar cell.

Current generated from the solar cell is transferred to a junction box through a bus bar. In general, when the bus bar formed at a top surface of a solar cell panel is connected to the junction box formed at a bottom surface of a lower substrate, the bus bar may be partially exposed to the outside so that the reliability may be reduced.

When the junction box is formed at the bottom surface of the lower substrate, because a junction area between the lower substrate and the junction box is not wide, the lower substrate and the junction box may be separated from each other due to external pressure so that it is necessary to reinforce a bonding strength between the lower substrate and the junction box.

DETAILED DISCLOSURE

Technical Problem

The embodiment provides a solar cell module and a method of fabricating the same.

Technical Solution

According to the embodiment, there is provided a solar cell module including: a support substrate having a single hole at a peripheral region of the support substrate; solar cells at an upper portion of the support substrate; a bus bar electrically connected to the solar cells; and a junction box connected to the bus bar, wherein the junction box includes an insertion part partially inserted in the single hole.

Advantageous Effects

In the solar cell module according to the embodiment, since the single hole is formed at the peripheral region of the support substrate, the junction box fills the single hole and makes contact with the bus bar, so the bus bar may be coupled with the junction box without being exposed to the outside so that the reliability of devices can be improved.

Further, since the single hole is formed at the support substrate to connect a bus bar serving as an anode to the junction box, structural stress of the support substrate due to the formation of the single hole can be attenuated.

Since a protrusion is inserted and coupled so that the junction box fills the hole formed at the lower substrate, the structure of the solar cell module can be securely supported.

Meanwhile, when a groove is formed, a failure rate occurring during a process of forming the hole at the support substrate can be reduced.

BEST MODE

Mode for Invention

Figure 1:
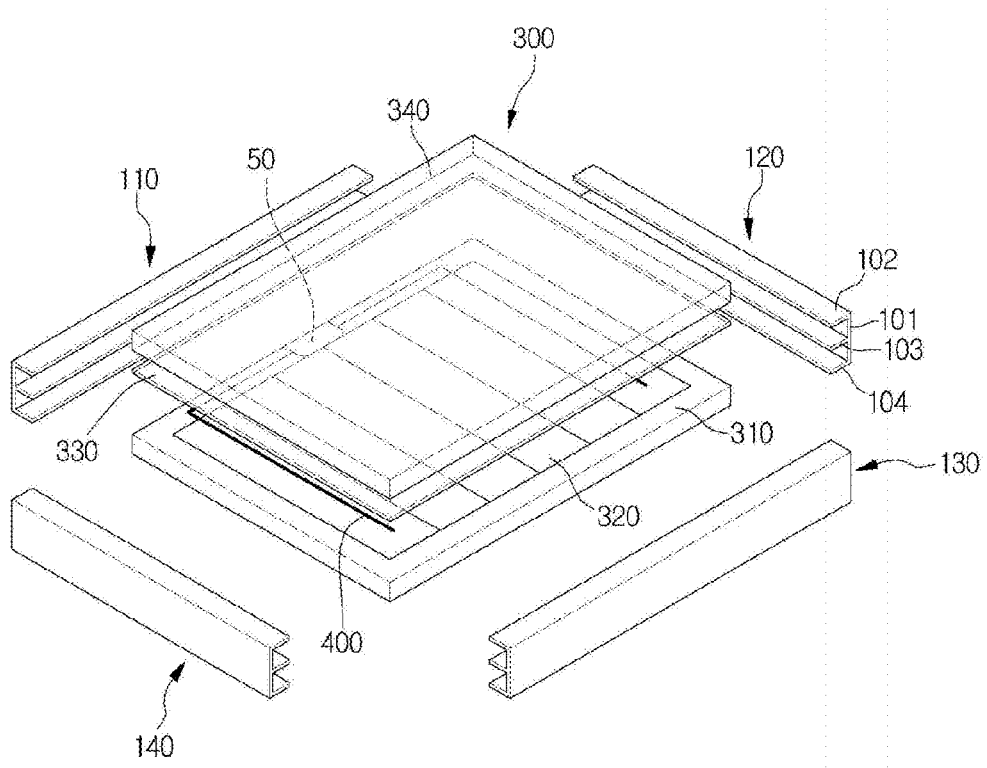
FIG. 1 is a perspective view showing a solar cell module according to the first embodiment.

In the description of the embodiments, it will be understood that when a panel, a bar, a frame, a substrate, a hole, or a film, is referred to as being "on" or "under" another panel, another bar, another frame, another substrate, another hole, or another film, it can be "directly" or "indirectly" on the other panel, the other bar, the other frame, the other substrate, the other hole, the other film, or one or more intervening layers may also be present. Such a position of the layer has been described with reference to the drawings. The size of the elements shown in the drawings may be exaggerated for the purpose of explanation and may not utterly reflect the actual size.

Figure 2:
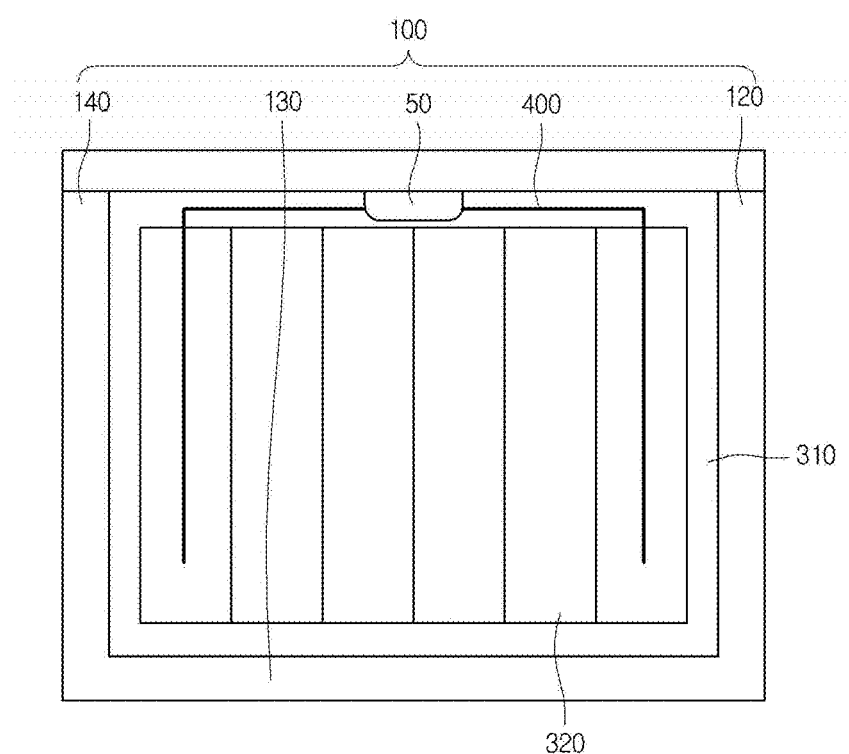
FIG. 2 is a top view showing the solar cell module of FIG. 1.
Figure 3:
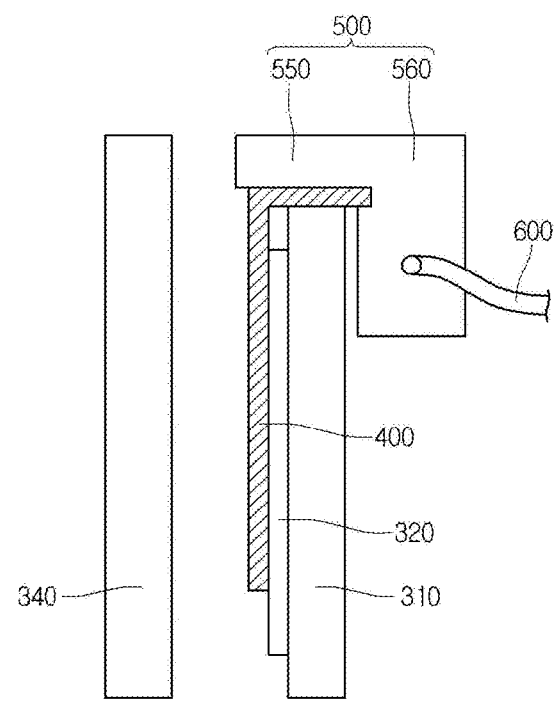
FIG. 3 is a sectional view showing the solar cell module of FIG. 1.
Figure 4:
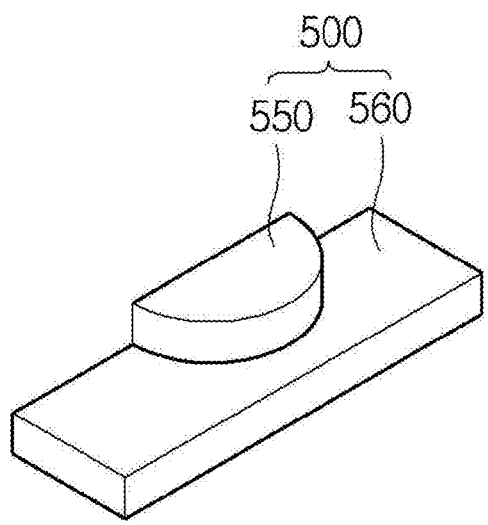
FIG. 4 is a perspective view showing a junction box of FIG. 1.

FIG. 1 is a perspective view showing a solar cell module according to the first embodiment. FIG. 2 is a top view showing the solar cell module of FIG. 1. FIG. 3 is a sectional view showing the solar cell module of FIG. 1. FIG. 4 is a perspective view showing a junction box of FIG. 1.

The solar cell module according to the embodiment includes solar cells 320, a support substrate 310 supporting the solar cells 320, a single hole 50 formed at a peripheral region of the support substrate 310, a bus bar 400 electrically connected to the solar cells 320, and a junction box 500 connected to the bus bar 400, and the junction box 500 is partially formed in the single hole 50 of the support substrate 310.

The support substrate 310 may be an insulator. The support substrate 310 may be a glass substrate, a plastic substrate or a metal substrate. In detail, the lower substrate 310 may be a soda lime glass substrate. The support substrate 310 may be transparent. The support substrate 310 may be rigid or flexible.

The solar cells 320 may be formed on the support substrate 310 and have a plate shape. For example, the solar cells 320 may have a square plate shape. The solar cells 320 receive solar light and convert the solar light into electric energy.

Frames 110, 120, 130, and 140 may be formed at sides of the solar cells 320 to receive the solar cells 320, respectively. For example, the frames 110, 120, 130, and 140 may be disposed at four sides of the solar cells 320, respectively. For example, a material used for the frames 110, 120, 130, and 140 may include metal such as aluminum.

A protective layer 330 protecting the solar cells 320 and an upper substrate 340 disposed on the protective layer 330 may be formed at upper portions of the solar cells 320, respectively, and these components are integrally formed with each other through a lamination process.

The upper substrate 340 and the support substrate 310 protect the solar cells 320 from an external environment. The upper substrate 340 and the support substrate 310 may have a multi-layer structure including a layer for preventing moisture and oxygen from being infiltrated, a layer for preventing chemical corrosion, and a layer having insulation characteristics.

The protective layer 330 is integrated with the solar cells 320 through a lamination process in a state that is disposed at upper portions of the solar cells 320, and prevents corrosion due to infiltration of moisture and protects the solar cells 320 from impact. The protective layer 330 may include a material such as ethylene vinyl acetate (EVA). The protective layer 330 may be further formed at lower portions of the solar cells 320.

The upper substrate 340 may be formed on the protective layer 330. The upper substrate 340 includes tempered glass representing high transmittance rate and a superior damage preventing function. In this case, the tempered glass may include low-iron tempered glass. To improve a scattering effect of light, an inner side of the upper substrate 340 may be embossed.

A bus bar 400 is connected to the solar cells 320. For example, the bus bar 400 is disposed on top surfaces of outermost solar cells 320. The bus bar 400 may make direct contact with the top surfaces of the outermost solar cells 320. A bus bar formed at one end of the solar cells 320 and a bus bar formed at an opposite end of the solar cells 320 may have mutually different polarities. For example, when the bus bar formed at the one end of the solar cells 320 acts as an anode, the bus bar formed at the opposite end of the solar cells 320 may act as a cathode.

The bus bar 400 may extend downward through a hole 50 which is formed at a peripheral region of the support substrate 310. The hole 50 is prepared as a single hole, and the bus bars 400 formed at both ends of the single hole 50 extend laterally and then downward along the support substrate 310 through the peripheral region of the hole 50. The hole 50 is formed at a transverse side of the support substrate 310 in the drawing, but may be formed at a longitudinal side of the support substrate 310.

The hole 50 may be formed at an edge of the support substrate 310. In detail, the hole 50 is formed through the support substrate and makes contact with the corner of the support substrate 310. Accordingly, when the hole 50 has a spherical shape, as shown in FIG. 2, a section of the hole 50 has a square shape and a peripheral region of the hole 50 is rounded.

The solar cells 320 have a width less than that of the support substrate 310. Since the hole 50 is formed at a peripheral region of the support substrate 310 in which the solar cells 320 are not formed, a light receiving area may be ensured.

The junction box 500 is electrically connected to the solar cells 320 through the bus bar 400. The junction box 500 may include an insertion part 550 partially inserted in the hole 50 which is formed at the peripheral region of the support substrate 310 and a support part 560 supporting the insertion part 550 at a lower portion of the insertion part 550.

The insertion part 550 of the junction box 500 may have an area corresponding to the hole 50.

In detail, the bus bar 400 extends to the hole 50 and is inserted into the hole 50, and the bus bar 400 is bent and makes the junction box 500 which is formed at the lower portion of the support substrate 310.

The bus bar 400 may be inserted into the hole 50 along a peripheral region of the hole 50. In detail, the bus bar 400 may be inserted into the hole 50 along a surface making contact with the support substrate 310 among surfaces formed by the hole 50.

The junction box 500 includes an insertion part 550 inserted into the hole 50 and a support part 560 supporting the insertion part 550, and the insertion part 550 has a shape corresponding to the hole 50.

The bus bar 400 may be connected to the junction box 500 through a top surface of the support part 560, that is, the top surface of the support part 560 making contact with a bottom surface of the support substrate 310. The bus bar 400 may be bent and extend from top surfaces of the solar cells 320 to the hole 50.

The junction box 500 includes a bypass diode and may receive a circuit board which is connected to the bus bar 400 and a cable 600. The cable 600 is connected to the circuit board, and is electrically connected to the solar cells 320 through the junction box 500.

Generally, to connect bus bars acting as an anode and a cathode to a junction box formed at a bottom surface of the support substrate 310, respectively, a hole is formed at one surface of the support substrate 310, and the bus bars are electrically connected to the junction box 500 through the hole. Since the junction box 500 is bonded to a bottom surface of the support substrate by a bonding area so that it is necessary to reinforce a bonding strength between the lower substrate the junction box.

In the embodiment, the hole 50 is formed at an edge of the support substrate 310, and the bus bar 400 is bent through the hole 50 to make contact with the junction box 500. Since the insertion part 550 of the junction box 500 fills the hole 50, the bus bar 400 is not exposed to the outside through the insertion part 550 so that the reliability can be improved.

A bonding area between the junction box 500 and the support substrate 310 may be increased and the junction box 500 may be firmly coupled with the support substrate 310 by the insertion part 550, thereby preventing the junction box 500 from being separated from the support substrate 310 due to external pressure.

FIG. 4 is a perspective view showing a junction box according to the embodiment. As shown in FIG. 4, the junction box 500 may include a support portion 560 and an insertion part 550.

The insertion part 550 is inserted into the hole 50, and the support part 560 supports the insertion part 550 and is formed at a bottom surface of the support substrate 310. The support part 560 may have a sectional area wider than a sectional area of the insertion part 550.

The insertion part 550 may be formed at the same height as that of the support part 560, and may be formed at the same height as that of the support substrate 310.

Hereinafter, another embodiment of a solar cell module will be described with reference to FIGS. 5 to 8.

Figure 5:
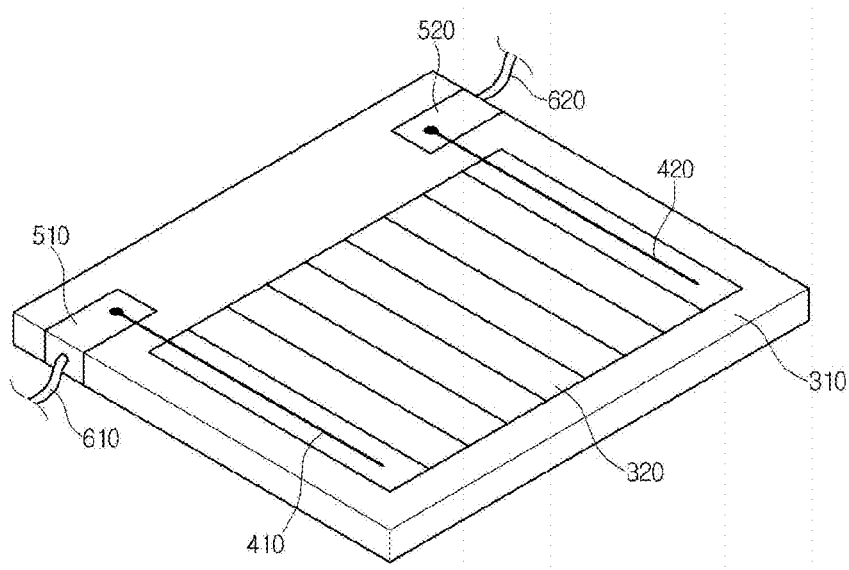
FIG. 5 is a perspective view showing a solar cell module according to the second embodiment.
Figure 6:
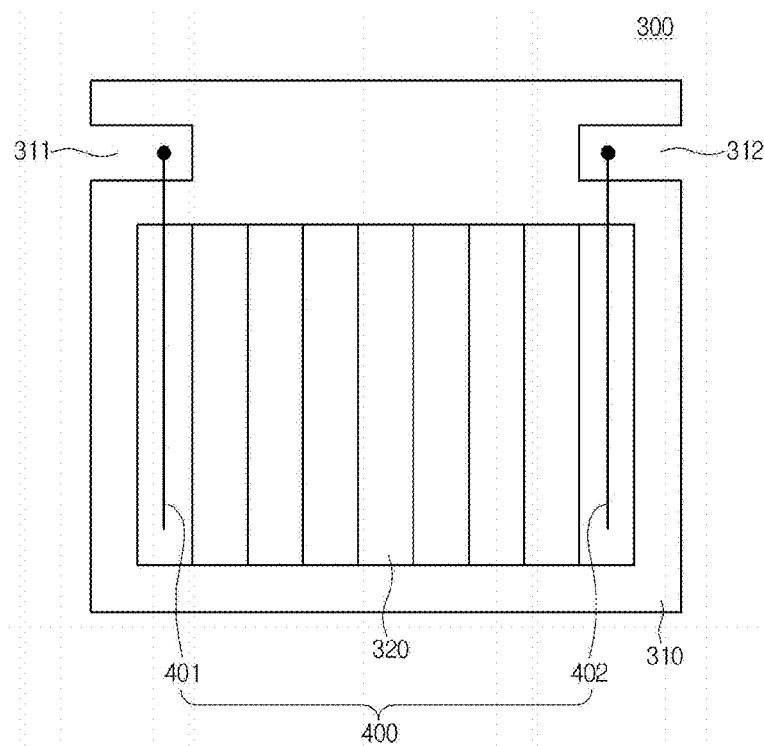
FIG. 6 is a top view showing a solar cell module according to the embodiment.

FIG. 5 is a perspective view showing a solar cell module according to the second embodiment. FIG. 6 is a top view showing a solar cell module of FIG. 5.

Referring to FIGS. 5 and 6, the solar cell module according to the embodiment includes solar cells 320, a support substrate 310 supporting the solar cells 320, a bus bar 400 electrically connected to the solar cells 320, and a junction box 500 connected to the bus bar 400, and the junction box 500 is mounted in a side of the support substrate 310.

The support substrate 310 may be an insulator. The support substrate 310 may be a glass substrate, a plastic substrate or a metal substrate. In detail, the support substrate 310 may be a soda lime glass substrate. The support substrate 310 may be transparent. The support substrate 310 may be rigid or flexible.

The solar cells 320 may be formed on the support substrate 310 and have a plate shape. For example, the solar cells 320 may have a square plate shape. The solar cells 320 receive solar light and convert the solar light into electric energy.

Frames (not shown) may be formed at sides of the solar cells 320 to receive the solar cells 320, respectively. For example, the frames may be disposed at four sides of the solar cells 320, respectively. For example, a material used for the frames may include metal such as aluminum.

A protective layer (not shown) protecting the solar cells 320 and an upper substrate (not shown) disposed on the protective layer may be formed at upper portions of the solar cells 320, respectively, and these components are integrally formed with each other through a lamination process.

The upper substrate and the support substrate 310 protect the solar cells 320 from an external environment. The upper substrate and the support substrate 310 may have a multi-layer structure including a layer for preventing moisture and oxygen from being infiltrated, a layer for preventing chemical corrosion, and a layer having insulation characteristics.

The protective layer is integrated with the solar cells 320 through a lamination process in a state that is disposed at upper portions of the solar cells 200, and prevents corrosion due to infiltration of moisture and protects the solar cells 320 from impact. The protective layer may include a material such as ethylene vinyl acetate (EVA). The protective layer may be further formed at lower portions of the solar cells 320.

An upper substrate may be formed on the protective layer. The upper substrate includes tempered glass representing high transmittance rate and a superior damage preventing function. In this case, the tempered glass may include low-iron tempered glass. To improve a scattering effect of light, an inner side of the upper substrate may be embossed.

The bus bar 400 is connected to the solar cells 320. For example, the bus bar 400 is disposed on top surfaces of outermost solar cells 320. The bus bar 400 makes direct contact with the top surfaces of the outermost solar cells 320. A bus bar 410 formed at one end of the solar cells 320 and a bus bar 420 formed at an opposite end of the solar cells 320 have mutually different polarities. For example, when the bus bar 410 formed at the one end of the solar cells 320 acts as an anode, the bus bar 420 formed at the opposite end of the solar cells 320 may act as a cathode.

A junction box 500 is electrically connected to the solar cells 320. The junction box 500 may be formed at a peripheral region of the support substrate 310, and is connected to the bus bars 401 and 402, respectively. In detail, the junction box 500 may be formed at both ends of the support substrate 310 to make contact with the bus bar 410 formed at the one end of the solar cells 320 and the bus bar 420 formed at the opposite end of the solar cells 320.

To this end, grooves 311 and 312 are formed at sides of the support substrate 310, respectively. The grooves 311 and 312 may be formed by processing a part of the support substrate 310, and are formed at a transverse side of the support substrate 310 in FIG. 6, but may be formed at a longitudinal side of the support substrate 310.

Since the solar cells 320 have a width less than that of the support substrate 310 and the grooves 311 and 312 are formed at a peripheral region of the support substrate 310 in which the solar cells 320 are not formed, a light receiving area may be ensured.

The junction box 500 may fill the holes 311 and 312, respectively. The junction box 500 may have an area corresponding to the grooves 311 and 312.

In detail, since the grooves 311 and 312 are formed at the sides of the support substrate 310 to have a '⊓' shape, the junction box 500 may have the '⊏' shape to fill the grooves 311 and 312.

Although a plurality of grooves are formed at both sides of the support substrate 310 in the embodiment, one groove may be formed at an upper center region of the support substrate 310 and the junction box 500 may fill the one groove.

The bus bars 401 and 402 acting as an anode and a cathode may be connected to the junction box 500, respectively.

For example, the junction box 500 includes a junction box 510 of an anode connected to the bus bar 410 acting as the anode and a junction box 520 of a cathode connected to the bus bar 420 acting as the cathode, and the junction box 510 of the anode and the junction box 520 of the cathode may be electrically connected to each other by the solar cells 320.

The side of the support substrate 310 may share the same straight line with sides of the junction boxes 510 and 520. That is, the junction boxes 510 and 520 may have the same area as areas of the grooves 311 and 312.

Figure 7:
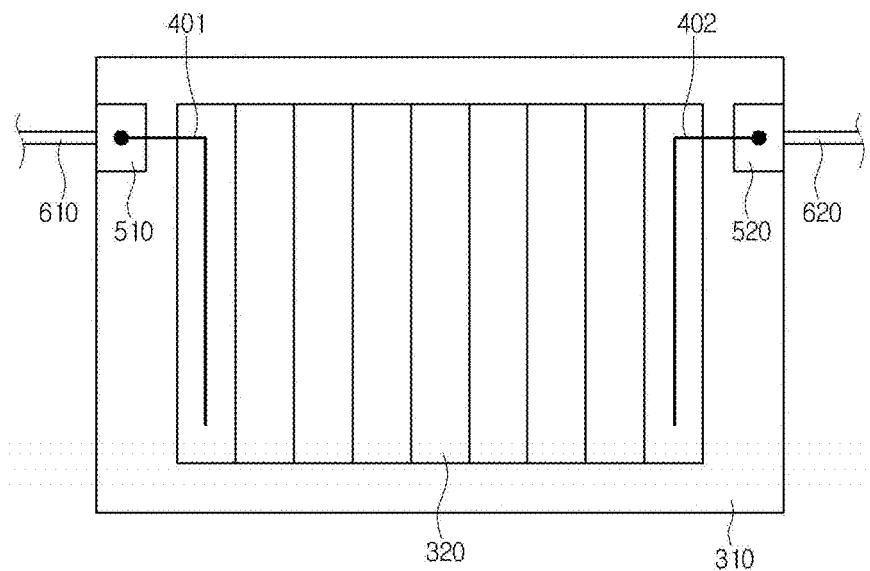
FIG. 7 is a top view showing a solar cell module according to the third embodiment.

FIG. 7 is a top view showing a solar cell module according to third embodiment. The junction box 510 of the anode and the junction box 520 of the cathode are formed at sides of the solar cells 320, and the bus bars 401 and 402 are connected to the junction boxes 510 and 520, respectively. As described above, since the junction box 510 of the anode and the junction box 520 of the cathode are formed at sides of the solar cells 320, there is no need to reduce light receiving areas of the solar cells 320 to form the grooves 311 and 312 so that the light receiving areas can be ensured.

The junction box 500 includes a bypass diode and may receive a circuit board which is connected to the bus bar 400 and a cable 600. The solar cell module according to the embodiment may further include a wire which connects the bus bar 400 to a circuit board. The cable 600 is connected to the circuit board, and is connected to the solar cells 320 through a connector 515 of the junction box 500.

Cables 610 and 620 may be connected to sides of the junction boxes 510 and 520, respectively.

Generally, to connect bus bars acting as an anode and a cathode to a junction box formed at a bottom surface of the support substrate 310, respectively, a hole is formed at the support substrate 310. Since the number of processes is increased in the procedure and the support substrate is damaged during a procedure of forming the hole, the reliability and the productivity can be lowered.

In the embodiment, the groove is formed at the side of the support substrate 310 and the bus bar is connected to the junction box through the groove. Since the junction box has the size corresponding to the groove of the support substrate 310 and is disposed at the side of the support substrate 310, the hole is not formed in the support substrate and the junction box may be electrically connected to the bus bar, the reliability and the productivity can be improved.

Figure 8:
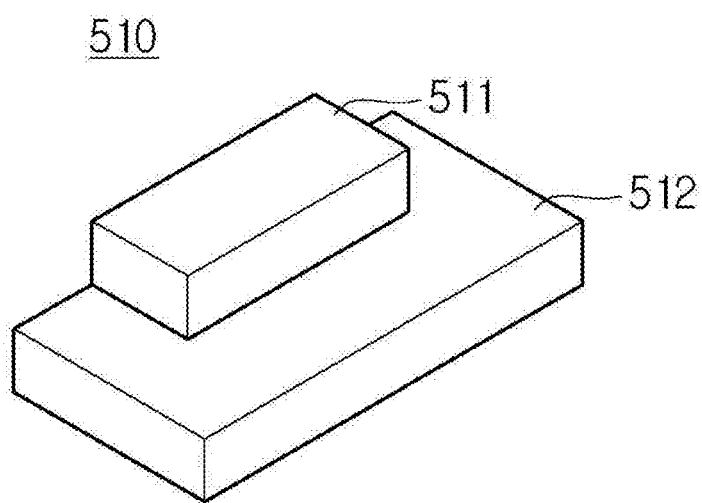
FIG. 8 is a perspective view showing a junction box of FIG. 5.

FIG. 8 is a perspective view illustrating a junction box of FIGS. 5 and 7. For example, FIG. 8 illustrates a junction box 510 connected to an anode, but the junction box 510 may be connected to a cathode. As shown in FIG. 8, the junction box 510 may include a support part 512 and an insertion part 511.

The insertion part 511 is inserted into the groove 311, the support part 512 supports the insertion part 511 and is formed at a bottom surface of the support substrate 310. A section of the support part 512 may have an area wider than an area of a section of the insertion part 511 or the same area than that of the section of the insertion part 511.

Figure 9:
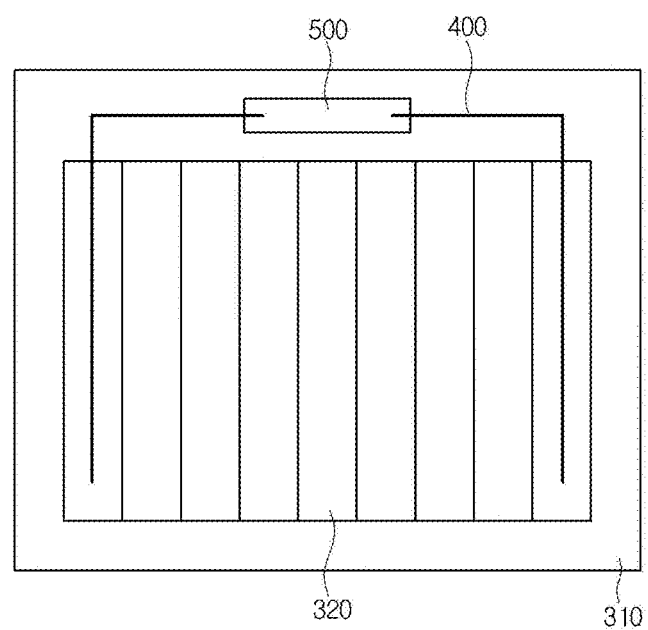
FIG. 9 is a top view showing the junction box of FIGS. 5 and 7.

FIG. 9 is a top view illustrating a solar cell module according to another embodiment. As shown in FIG. 9, the junction box 500 is completely inserted into a groove, so the groove is not formed at a side of the support substrate 310 but is formed inside the support substrate 310. In this case, the solar cell module is easily applicable to a Building Integrated Photovoltaic System (BIPV).

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell module comprising:
    a support substrate having a top surface, a bottom surface, a first side surface, a second side surface, a third side surface, a fourth side surface, a first groove at a first outer edge of the support substrate and a second groove at a second outer edge of the support substrate opposite to the first outer edge, wherein the first groove directly physically contacts the first side surface of the support substrate, and the second groove directly physically contacts the second side surface of the support substrate;
    solar cells at an upper portion of the support substrate;
    a bus bar of an anode and a bus bar of a cathode electrically connected to the solar cells;
    a junction box of the anode connected to the bus bar of the anode and disposed in the first groove;
    a junction box of the cathode connected to the bus bar of the cathode and disposed in the second groove;
    a protective layer on the solar cells; and
    an upper substrate on the protective layer;
    wherein the support substrate is a soda lime glass substrate,
    wherein the protective layer includes ethylene vinyl acetate (EVA) and is integrated with the solar cells,
    wherein the upper substrate includes a low-iron tempered glass,
    wherein an inner side of the upper substrate is embossed and is in direct physical contact with the protective layer,
    wherein the protective layer and the upper substrate do not include a through hole,
    wherein the first and second grooves are disposed inside the support substrate, wherein the first and second grooves are formed at a peripheral region of the support substrate in which the solar cells are not formed,
    wherein the junction box of the anode has a shape corresponding to the first groove,
    wherein the junction box of the cathode has a shape corresponding to the second groove;
    wherein the junction box of the anode is inserted into the first groove and fills the first groove,
    wherein the junction box of the cathode is inserted into the second groove and fills the second groove,
    wherein the first groove includes three inner surfaces,
    wherein the second groove includes three inner surfaces,
    wherein the junction box of the anode comprises a first insertion part inserted in the first groove and a first support part supporting the first insertion part of the junction box of the anode,
    wherein the junction box of the cathode comprises a second insertion part inserted in the second groove and a second support part supporting the second insertion part of the junction box of the cathode,
    wherein the first insertion part of the junction box of the anode includes a top surface and a first, a second, a third, and a fourth side surfaces,
    wherein the first, second, and third side surfaces of the first insertion part of the junction box of the anode are respectively in direct physical contact with the three inner surfaces of the first outer groove,
    wherein the fourth side surface of the first insertion part of the junction box of the anode shares a same plane with the first outer edge of the support substrate,
    wherein the top surface of the first insertion part of the junction box of the anode is coplanar with the top surface of the support substrate,
    wherein the second insertion part of the junction box of the cathode includes a top surface and a first, a second, a third, and a fourth side surfaces, wherein the first, second, and third side surfaces of the second insertion part of the junction box of the cathode are respectively in direct physical contact with the three inner surfaces of the second groove, wherein the fourth side surface of the second insertion part of the junction box of the cathode shares a same plane with the second outer edge of the support substrate, wherein the top surface of the second insertion part of the junction box of the anode is coplanar with the top surface of the support substrate, wherein the first insertion part of the junction box of the anode has an area corresponding to the first groove, wherein the second insertion part of the junction box of the cathode has an area corresponding to the second groove, wherein the first insertion part of the junction box of the anode has a height corresponding to the first groove and the support substrate, wherein the second insertion part of the junction box of the cathode has a height corresponding to the second groove and the support substrate, wherein the first insertion part of the junction box of the anode has a width corresponding to the first groove, wherein the second insertion part of the junction box of the cathode has a width corresponding to the second groove, wherein a top surface of the support part of the junction box of the anode is in direct physical contact with the bottom surface of the support substrate, wherein a top surface of the support part of the junction box of the cathode is in direct physical contact with the bottom surface of the support substrate, wherein the bus bar of the anode extends in only one direction, wherein the bus bar of the anode comprises a first contact part in direct physical contact with at least one of the solar cells and a second contact part in direct physical contact with the top surface of the first insertion part of the junction box of the anode, wherein the bus bar of the cathode extends in only one direction, wherein the bus bar of the cathode comprises a first contact part in direct physical contact with at least one of the solar cells and a second contact part in direct physical contact with the top surface of the second insertion part of the junction box of the cathode, wherein each bus bar extends in a line shape from the first contact part to the second contact part, wherein the bus bar of the anode is disposed in parallel with the bus bar of the cathode, and wherein the solar cells are in direct physical contact with the top surface of the support substrate.

2. The solar cell module of claim 1, further comprising a first cable connected to a side of the junction box of the anode, and a second cable connected to a side of the junction box of the cathode.

\* \* \* \* \*